(12) United States Patent
Ichiki et al.

(10) Patent No.: US 10,134,508 B2
(45) Date of Patent: Nov. 20, 2018

(54) $MGB_2$ SUPERCONDUCTIVE WIRE MATERIAL, AND PRODUCTION METHOD THEREFOR

(71) Applicant: Hitachi, Ltd., Chiyoda-ku, Tokyo (JP)

(72) Inventors: Youta Ichiki, Tokyo (JP); Kazuhide Tanaka, Tokyo (JP); Motomune Kodama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 56 days.

(21) Appl. No.: 15/038,346

(22) PCT Filed: Dec. 10, 2013

(86) PCT No.: PCT/JP2013/083028
§ 371 (c)(1),
(2) Date: May 20, 2016

(87) PCT Pub. No.: WO2015/187387
PCT Pub. Date: Jun. 18, 2015

(65) Prior Publication Data
US 2016/0293296 A1    Oct. 6, 2016

(51) Int. Cl.
*H01B 12/04*    (2006.01)
*H01L 39/14*    (2006.01)
*H01L 39/24*    (2006.01)
*H01B 1/02*    (2006.01)
*H01B 13/00*    (2006.01)
*H01F 6/00*    (2006.01)

(52) U.S. Cl.
CPC .............. *H01B 12/04* (2013.01); *H01B 1/02* (2013.01); *H01B 13/0036* (2013.01); *H01F 6/00* (2013.01); *H01L 39/141* (2013.01); *H01L 39/2487* (2013.01)

(58) Field of Classification Search
CPC .................................. H01B 12/04; H01B 1/02
See application file for complete search history.

(56) References Cited

U.S. PATENT DOCUMENTS

2008/0274901 A1\* 11/2008 Glowacki ............. H01L 39/141
505/230

FOREIGN PATENT DOCUMENTS

| JP | 2003-31057 A | 1/2003 |
|---|---|---|
| JP | 2005-310600 A | 11/2005 |
| JP | 2009-134969 A | 6/2009 |
| JP | 2011-14304 A | 1/2011 |

(Continued)

OTHER PUBLICATIONS

International Search Report (PCT/ISA/210) issued in PCT Application No. PCT/JP2013/083028 dated Mar. 11, 2014 with English-language translation (two (2) pages).

(Continued)

*Primary Examiner* — Paul A Wartalowicz
(74) *Attorney, Agent, or Firm* — Crowell & Moring LLP

(57) ABSTRACT

An $MgB_2$ superconducting wire includes a core containing $MgB_2$ and a metal sheath which surrounds the core. The core includes at least a first $MgB_2$ core positioned on the center side, and a second $MgB_2$ core positioned outside the first $MgB_2$ core, and the density of the second $MgB_2$ core is lower than the density of the first $MgB_2$ core.

5 Claims, 6 Drawing Sheets

(56) References Cited

FOREIGN PATENT DOCUMENTS

JP          4667638 B2    1/2011
WO    WO 2008/122802 A1   10/2008

OTHER PUBLICATIONS

Japanese-language Written Opinion (PCT/ISA/237) issued in PCT Application No. PCT/JP2013/083028 dated Mar. 11, 2014 (three (3) pages).
Extended European Search Report issued in counterpart European Application No. 13899326.6 dated Jul. 20, 2017 (Six (6) pages).
Kario A., et al., "Novel exsitu $MgB_2$ Barrier for in situ Monofilamentary $MgB_2$ Conductors with Fe and Cu Sheath Material," Superconductor Science and Technology, 23, (2010) 025018, IOP Publishing Ltd., pp. 1-6, XP 020173362 (Six (6) pages).
Nakane, T., et al. "Fabrication of Cu-sheathed $MgB_2$ Wire with High $J_c$-B Performance Using a Mixture of in situ and ex situ PIT Techniques," Physica C, 469 (2009), pp. 1531-1535, XP 026447609 (Five (5) pages).

\* cited by examiner

MGB$_2$ SUPERCONDUCTIVE WIRE MATERIAL, AND PRODUCTION METHOD THEREFOR

TECHNICAL FIELD

The present invention relates to an MgB$_2$ superconducting wire and a production method therefor.

BACKGROUND ART

Magnesium diboride (MgB$_2$) has a critical temperature (transition temperature) of 39 K, which is higher than the critical temperature of conventional metal superconductors (e.g., niobium titanium (NbTi), niobium-3-tin (Nb$_3$Sn)). Therefore, it is possible to operate by a superconducting magnet using MgB$_2$ without using expensive and rare liquid helium (boiling point: 4.2 K). Also, as compared to an oxide-based superconductor, the superconducting magnet using MgB$_2$ has a characteristic that the magnetic field stability is high when operated under a permanent current mode.

It is necessary to wind wire in a coil shape using MgB$_2$ as a wire, to constitute an MgB$_2$ superconducting magnet. As the requirement specification to a wire, two important things are that it is possible to energize at a high current density even in a high magnetic field, and that critical current (Ic) is uniform over a long length (for example, a length of 1 km or more). An MgB$_2$ superconducting wire is generally prepared by a method of filling a powder of a mixed powder of magnesium (Mg) and boron (B) or an MgB$_2$ powder, further added with a third element (carbon, etc.) thereto, in a metal tube, and subjecting it to wire drawing (powder-in-tube method, hereinafter abbreviated as PIT method). In the case of filling the mixed powder of Mg and B (in-situ method), the drawn wire is heat-treated to produce MgB$_2$. Also, in the case of filling the MgB$_2$ powder (ex-situ method), heat treatment is usually performed for improving binding of particles.

FIG. 1A and FIG. 1B are an example of a schematic cross-sectional view of a conventional MgB$_2$ superconducting wire prepared by PIT method. An MgB$_2$ superconducting wire 11 is constituted by an internal MgB$_2$ core 12 and a metal sheath 13 positioned outside the core 12. The metal sheath 13 is constituted by a barrier layer 14 positioned in the side of the core 12 and a stabilizing layer 15 positioned outside the barrier layer 14. The barrier layer 14 is a layer for preventing a reaction of the stabilizing layer with a filler powder in a heat treatment process, and is a layer of iron (Fe), niobium (Nb) or the like. The stabilizing layer 15 is a layer having high electric conductivity and thermal conductivity, and is a layer of copper (Cu) or the like.

It is necessary for improving a current density (critical current density, Jc) which can energize a wire, that the electric connection degree between MgB$_2$ particles is high, specifically, void and different phase (unreacted product, oxide, etc.) between particles are less. By the in-situ method described above, MgB$_2$ is produced after wire drawing, thus MgB$_2$ particles are likely to bind each other. However, volume shrinkage occurs in the reaction of Mg+2B→MgB$_2$, thus even if the filling rate after wire drawing is high as about 90%, it reduces to 67% after heat treatment.

In the in-situ method, as a method for improving an initial filling rate, mechanical milling of raw material powder is effective. Powders of Mg and B and a metal ball are put in a metal container and rotated at a high speed using a planetary ball mill apparatus, whereby hard B powder is sunk into soft Mg powder. When the mixed powder is filled in a metal tube, and the metal tube is subjected to wire drawing, there is almost no void between powder particles, thus the initial filling rate becomes a value close to 100%. Whereby, the filling rate also improves to 74%.

On the other hand, in the ex-situ method, volume shrinkage does not occur like in the in-situ method, thus high filling rate (about 80%) after wire drawing is maintained, but there is a difficulty that the produced MgB$_2$ particles are unlikely to sinter each other. In order to improve sinterability in the ex-situ method, there is also an intermediate method (Premix method) of adding a mixed powder of Mg and B to an MgB$_2$ powder. Relating to the above technologies, Patent Literature 1 and Patent Literature 2 are known.

CITATION LIST

Patent Literature

PTL 1: Publication of Patent No. 4667638
PTL 2: Japanese Patent Laid-Open No. 2003-031057

SUMMARY OF INVENTION

Technical Problem

When an in-situ method, an ex-situ method or a Premix method by a mixed powder subjected to mechanical milling is adopted, for the purpose of improving Jc of a wire, Jc of a short-length sample certainly improves. However, in order to put the wire to practical use, it is important that a long wire can be manufactured, and its conduction characteristics are uniform over a whole length, thus the problem is to satisfy both high Jc and long length uniformity.

Long length uniformity of conduction characteristics of a wire refers to a uniformity of the MgB$_2$ core shape in the cross section of the wire. Specifically, it is required that there is no disturbance in the shape of MgB$_2$ core over the longitudinal direction (for example, in the case of a single core wire of circular cross section, the core shape is close to a true circle), or the cross sectional area of the core is uniform.

In the in-situ method of slightly mixing powders of Mg and B, a soft Mg powder extends in the longitudinal direction during the wire-drawing process, thus processability is good, and a load to a surrounding metal sheath is small. Therefore, long length uniformity is likely to be secured without disturbing the core shape. However, the mixed powder of Mg and B subjected to mechanical milling and the MgB$_2$ powder are hard, as compared to the Mg powder, thus the metal sheath is plastically deformed during the wire-drawing process. The transverse section and vertical section of the wire at that time are respectively shown in FIG. 1A and FIG. 1B. The barrier layer 14 is deformed during the wire-drawing process, whereby the shape of the MgB$_2$ core cross section becomes nonuniform in the longitudinal direction, and critical current (Ic) becomes nonuniform. When deformation is further advanced, and the barrier layer 14 is broken, Mg contained in the core 12 reacts with the stabilizing layer 15 during heat treatment, and Ic suddenly drops. Also, in the worst case, a crack in the barrier layer 14 functions as a starting point and leads to disconnection of wire during the wire-drawing process. It is necessary to thicken the barrier layer 14 for preventing it, whereby the current density is reduced.

An object of the present invention is to solve the above problem relating to both high Jc and long length uniformity of the MgB$_2$ superconducting wire, and to provide a wire capable of energizing at a high current density uniformly over a whole length, and a method for producing the wire.

Solution to Problem

The present inventors have studied to solve the above problems, and consequently found that the above problems can be solved by improving the constitution of the cross section of wire, thereby completing the present invention. In order to solve the above problems, for example, the constitution as set forth in the claims is adopted. The present application includes a plurality of means for solving the above problems, and an example thereof is to provide an MgB$_2$ superconducting wire including a core containing MgB$_2$ and a metal sheath which surrounds the core, the core including at least a first MgB$_2$ core positioned on the center side, and a second MgB$_2$ core positioned outside the first MgB$_2$ core, and the density of the second MgB$_2$ core is lower than the density of the first MgB$_2$ core.

In addition, according to other examples, a method for producing an MgB$_2$ superconducting wire that solves the above problems can be provided. The method for producing an MgB$_2$ superconducting wire includes the steps of preparing a powder molded body of Mg and B, filling the powder molded body of Mg and B in a metal tube, subjecting the metal tube to wire drawing, and heat-treating the metal tube, and the step of preparing a powder molded body of Mg and B includes the steps of preparing a columnar first molded body of a mixed powder of Mg and B and preparing a cylindrical second molded body of a mixed powder of Mg and B, having a density lower than that of the first molded body.

Advantageous Effects of Invention

According to the present invention, a superconducting wire having high conduction characteristics uniformly over a whole length can be provided. Further characteristics relating to the present invention are revealed from the description of the present specification and attached drawings. Also, problem, constitution and effect other than those described above will be revealed from the description of the following examples.

DESCRIPTION OF EMBODIMENTS

Hereinbelow, examples of the present invention will be described with reference to the attached drawings. The attached drawings show specific examples based on the principle of the present invention, and these are for understanding the present invention, and are certainly not used for restrictively interpreting the present invention.

First Embodiment

Figure 1A:
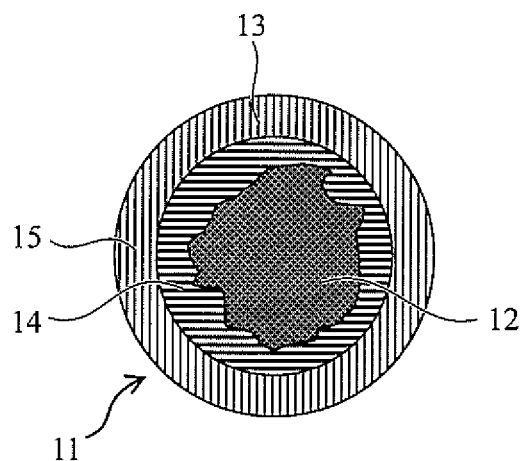
FIG. 1A is an example of a schematic view of a cross section perpendicular to the longitudinal direction (the extending direction of a wire) of a conventional MgB$_2$ superconducting wire prepared by PIT method.
Figure 1B:
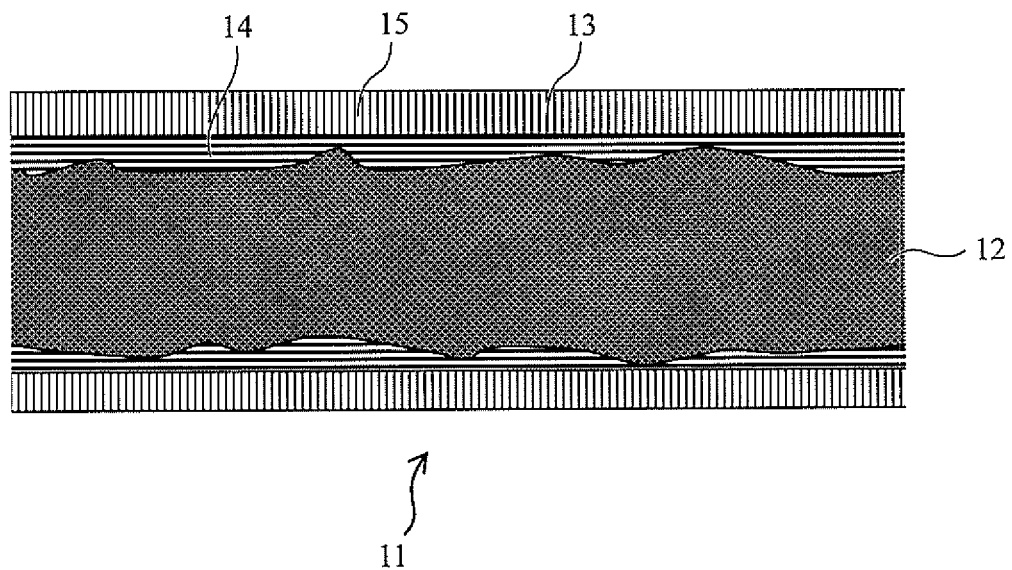
FIG. 1B is an example of a schematic view of a cross section along the longitudinal direction of a conventional MgB$_2$ superconducting wire prepared by PIT method.
Figure 2A:
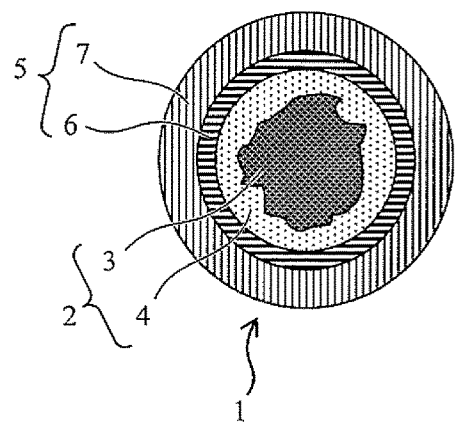
FIG. 2A is an example of a schematic view of a cross section perpendicular to the longitudinal direction of an MgB$_2$ superconducting wire in the first example of the present invention.
Figure 2B:
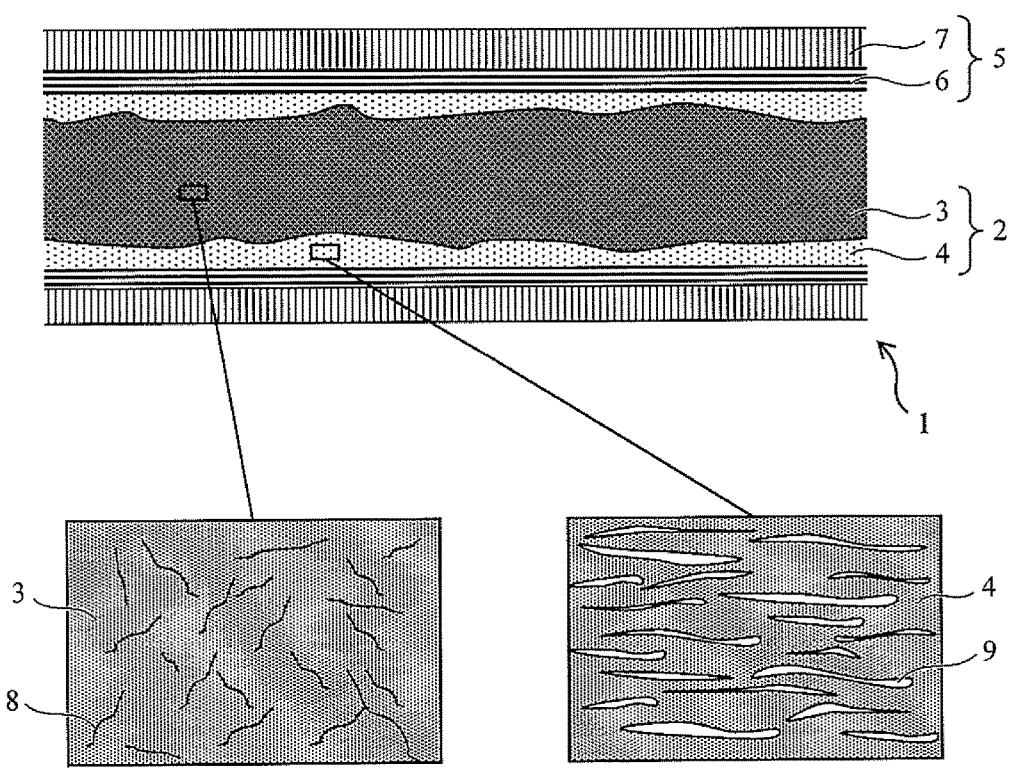
FIG. 2B is an example of a schematic view of a cross section along the longitudinal direction of an MgB$_2$ superconducting wire in the first example of the present invention.

FIG. 2A and FIG. 2B are an example of a schematic cross-sectional view of an MgB$_2$ superconducting wire in the first example of the present invention.

An MgB$_2$ superconducting wire 1 in the present example includes an MgB$_2$ core 2, and a metal sheath 5 which surrounds the MgB$_2$ core 2. The metal sheath 5 is constituted by a barrier layer 6 positioned in the side of the core 2 and a stabilizing layer 7 positioned outside the barrier layer 6.

As a characteristic of the present example, the MgB$_2$ core 2 is constituted by a high-density MgB$_2$ core 3 positioned at its center, and a low-density MgB$_2$ core 4 having a density lower than that of the high-density MgB$_2$ core 3, and positioned outside the high-density MgB$_2$ core 3. Therefore, the low-density MgB$_2$ core 4 is arranged adjacent to the barrier layer 6 of the metal sheath 5. The low-density MgB$_2$ core 4 has a density lower than that of the high-density MgB$_2$ core 3, and hereinbelow, details of these cores 3 and 4 will be described.

The high-density MgB$_2$ core 3 is a part filled with the mixed powder of Mg and B subjected to mechanical milling using a planetary ball mill apparatus (hereinafter referred to as strongly mixed powder) or MgB$_2$ powder. In the high-density MgB$_2$ core 3, only minute voids 8 of several μm or less are present, as shown in an enlarged view in FIG. 2B. Considering conduction characteristics and the like, the density of the high-density MgB$_2$ core 3 is preferably 70% or more of the true density of MgB$_2$ (2.62 g/cm).

The low-density MgB$_2$ core 4 is a part filled with a powder obtained by slightly mixing powders of Mg and B (hereinafter referred to as weakly mixed powder). During the wire-drawing process, a soft Mg powder is present in the part of the low-density MgB$_2$ core 4, thus the low-density MgB$_2$ core 4 functions as a cushioning material between the part of the high-density MgB$_2$ core 3 and the barrier layer 6. Whereby, deformation of the barrier layer 6 is suppressed, thus the break of the barrier layer 6 and disconnection of wire can be prevented. However, after the heat treatment, the part where Mg was present becomes a flat void 9 which extends in the longitudinal direction of an MgB$_2$ superconducting wire. The void 9 has a size of about several tens μm.

Figure 4:
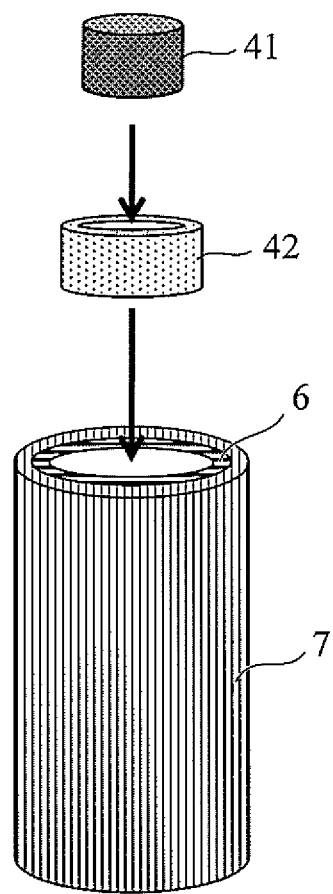
FIG. 4 is a diagram showing a powder filling method in the MgB$_2$ superconducting wire of the present invention.

For preparing the MgB$_2$ superconducting wire of the present example, it is necessary to constitute as such, when a raw material powder is filled in a metal tube. FIG. 4 is a view showing a powder filling method in the MgB$_2$ superconducting wire. In an example of FIG. 4, a raw material powder of the high-density MgB$_2$ core 3 and a raw material powder of the low-density MgB$_2$ core 4 are filled in a metal tube having the barrier layer 6 and the stabilizing layer 7. At that time, for realizing the constitution of the cross section as designed, it is desirable to fill each powder as a pressure-molded body. A columnar strongly mixed powder molded body 41 for the high-density MgB$_2$ core 3 is inserted into a cylindrical weakly mixed powder molded body 42 for the low-density MgB$_2$ core 4. A plurality of molded bodies each including the molded bodies 41 and 42 are filled in a metal tube, so as to have a desired length. Such molded bodies are filled, whereby it is possible to control initial powder arrangement and powder density, and it leads to improve long length uniformity.

Next, the method for producing an MgB$_2$ superconducting wire of the present invention will be specifically described.

<Preparation of Metal Tube>

A metal tube (metal sheath 5) is made to have a two-layer structure of the barrier layer 6 and the stabilizing layer 7.

The stabilizing layer 7 may not be present when only experimentally energizing to a short wire, but is essential in the case of being used as a coil or cable. In the present example, iron (Fe) was used in the barrier layer 6 and copper (Cu) was used in the stabilizing layer 7. The barrier layer 6 is required not to react with the filled Mg and B during heat treatment, and to have good processability since the wire needs to be drawn to a thin wire diameter. As such a material, other than Fe, niobium (Nb), tantalum (Ta), nickel (Ni) or an alloy containing them can be used.

The stabilizing layer 7 is required to have a low resistivity so as to be used as a current path when the superconductor is quenched (normal conduction transition), and have a high thermal conductivity, particularly in the case of conduction-cooling without refrigerant. As such a material, other than Cu, aluminum (Al), silver (Ag), gold (Au) or an alloy containing them can be used. The barrier layer 6 and the stabilizing layer 7 are desirably integrated in advance. As the procedure, there are a method of integrating the layers by mechanically applying a pressure and a method of electrochemically coating (plating). In the present example, a pipe obtained by plating a Fe tube with Cu was used.

<Raw Material Powder>

In the present example, using the high-density MgB$_2$ core 3 as a raw material powder, the mixed powder (strongly mixed powder) of Mg and B subjected to mechanical milling was filled in a metal tube. Specifically, the powders of Mg and B were weighed so as to be a stoichiometric composition, and put in a container made of tungsten carbide (WC) that was a hard metal, together with a ball made of WC, and treated at 400 rpm×6 hrs, using a planetary ball mill apparatus. When the B particles are sunk into the Mg particles, the mixing method may not be the method described above. In addition, while the strongly mixed powder of Mg and B was used in the present example, it is also effective to fill the MgB$_2$ powder for increasing the density. However, heat treatment at a high temperature for a long period of time is necessary for increasing binding of particles.

As a raw material powder of the low-density MgB$_2$ core 4, a powder obtained by slightly mixing Mg and B (weakly mixed powder) was used. Specifically, the powders of Mg and B were weighed so as to be a stoichiometric composition, and put in a plastic container, together with a ball made of SUS304, and mixed for 6 hrs, using a ball mill apparatus. It may be mixed using a V mixer or mortar, not limited to this method. In the case of using the above powder, the operation was carried out in a glove box for preventing oxidation. It is desirable that the water content and the oxygen amount in the glove box are both controlled to 10 ppm or less. In the case of improving conduction characteristics in a high magnetic field, it is effective to add a third element such as carbon, to the raw material powder of the high-density MgB$_2$ core 3 and the raw material powder of the low-density MgB$_2$ core 4.

<Powder Molding and Filling>

The raw material powder obtained as described above is pressurized to prepare a molded body. The strongly mixed powder is filled in a columnar mold. Also, the weakly mixed powder is filled in a cylindrical mold. Then, these molds were pressurized by a press machine. The molded body of strongly mixed powder and molded body of weakly mixed powder prepared herein were filled in a metal tube, then the density is improved by wire-drawing process. Therefore, it is not necessary to pressurize by large force herein, and the pressure that can be handled without breaking the molded body (several tens MPa) is enough.

A columnar strongly mixed powder molded body 41 (molded body for the high-density MgB$_2$ core 3) was inserted into a cylindrical weakly mixed powder molded body 42 (molded body for the low-density MgB$_2$ core 4), and this was filled in a metal tube. For realizing the constitution of the cross section of wire as designed, it is desirable to fill both weakly mixed powder and strongly mixed powder as a molded body, but it is not essential. For example, for reducing labor of preparing a molded body, after filling the cylindrical weakly mixed powder molded body 42 in the metal tube, it is also possible to fill a strongly mixed powder into a center hole by tapping.

<Wire-Drawing Process>

The metal tube filled with the raw material powder as described above was repeatedly processed using a wire-drawing apparatus, so as to have an area reduction ratio (cross-sectional area reduction ratio) per a path in a range of 8 to 12%, to be processed to a desired diameter ($\varphi$ 0.5 mm in the present example). As the wire-drawing apparatus, a hydrostatic pressure extruder, a draw bench, a wire-drawing machine, a swager, a cassette roller die, a grooved roll, or the like can be used.

<Heat Treatment>

Finally, the drawn wire is subjected to heat treatment (sintering heat treatment) of holding it in a non-oxidizing atmosphere, at a temperature of 600° C. and more and 850° C. or less, for several minutes to several ten hours. Whereby, an MgB$_2$ phase is produced to form an MgB$_2$ superconducting wire. The heat treatment is desirably performed in a non-oxidizing atmosphere, for preventing undesirable oxidation of the filler powder. Specifically, an inert gas such as argon (Ar) or nitrogen (N$_2$), or a vacuum having a degree of vacuum of medium vacuum or more (collectively called as non-oxidizing atmosphere) is desirable, and in any case, it is desirable that the contents of water and oxygen are both 10 ppm or less.

<Evaluation of Long Length Uniformity>

A wire of $\varphi$ 0.5 mm×300 m in length prepared as described above was cut by 30 m in length, and each end part was sampled (total of 11 pieces), embedded with resin, and polished, and the cross section was observed with an optical microscope. Whereby, long length uniformity of the MgB$_2$ core shape was evaluated. Specifically, in each cross section, circularity (maximum value of deviation from the average radius) of the MgB$_2$ core and variety of the MgB$_2$ core area were evaluated. For comparison, the same evaluation was performed for a wire prepared by a conventional method of filling only strongly mixed powder. As a result, in the wire by the conventional method, the maximum value of deviation from the average radius of the MgB$_2$ core was about 15% on average, and the variety of the $MgB_2$ core area was about ±5% on average. On the other hand, in the wire by the present example, the maximum value of deviation from the average radius of the $MgB_2$ core was about 5% on average, and the variety of the $MgB_2$ core area was about ±1% on average. Whereby, the effect of improving long length uniformity by two layer filling of strongly mixed powder and weakly mixed powder was confirmed.

<Evaluation of Conduction Characteristics>

For improving conduction characteristics, it is desirable that the cross sectional area of the high-density $MgB_2$ core 3 (the area of the cross section perpendicular to the longitudinal direction of the wire, corresponding to the cross section in FIG. 2A) is wide, in the range that the long length uniformity can be secured. Particularly, it is preferred that the cross sectional area of the high-density $MgB_2$ core 3 is 50% or more of the whole cross sectional area of the core 2. In the present example, the outer diameters of each layer when the final wire diameter was φ 0.5 mm were as follows; Cu: φ 0.5 mm, Fe: φ 0.4 mm, the low-density $MgB_2$ core 4 (weakly mixed powder): φ 0.3 mm, and the high-density $MgB_2$ core 3 (strongly mixed powder) : φ 0.23 mm, and the cross-sectional area ratio of the low-density core : the high-density core was about 4:6. Also, the density of the high-density $MgB_2$ core 3 in this example is 70% or more of the true density of $MgB_2$ (2.62 g/cm).

For comparison with the present example, a wire filled with only the weakly mixed powder (comparative example) was prepared. For the wire of the present example and the wire filled with the weakly mixed powder of the comparative example, the critical current density (Jc) of the $MgB_2$ core was evaluated though magnetization measurement, and consequently, Jc improvement of about 15% on average was confirmed at 20 K and 0 to 5 T. When the cross sectional area ratio of the high-density $MgB_2$ core is increased, further Jc improvement is expected.

Figure 5:
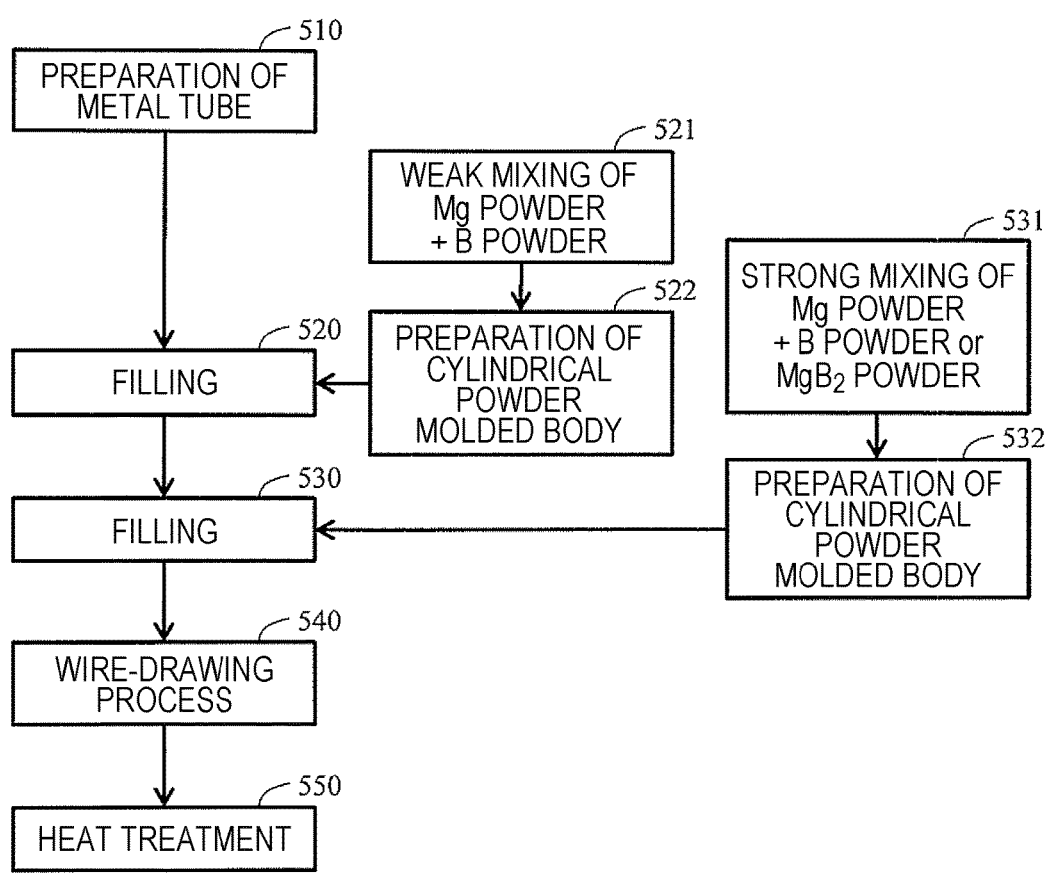
FIG. 5 is a diagram showing a step of producing the MgB$_2$ superconducting wire of the first example.

FIG. 5 is a diagram showing a method for producing the $MgB_2$ superconducting wire of the first example. First, as described above, a metal tube of a two-layer structure of a barrier layer 6 and a stabilizing layer 7 is prepared (510). Next, an Mg powder and a B powder are slightly mixed by any of the methods shown above, to form a weakly mixed powder of Mg and B (521). Thereafter, a molded body of a weakly mixed powder is prepared using a cylindrical mold (522), then the cylindrical weakly mixed powder molded body is filled in a metal tube (520).

Also, the Mg powder and the B powder are mixed by mechanical milling to form a strongly mixed powder of Mg and B (531). As a raw material powder of the high-density $MgB_2$ core 3, an $MgB_2$ powder may be used. Next, a molded body of a strongly mixed powder (or $MgB_2$ powder) is prepared using a columnar mold (532). Thereafter, the columnar strongly mixed powder molded body is filled in a metal tube (530). Here, a procedure of filling the weakly mixed powder molded body in a metal tube and then filling the strongly mixed powder molded body in a metal tube was used, and as described above, a procedure of filling the strongly mixed powder molded body in the weakly mixed powder molded body, then filling the molded body integrating the weakly mixed powder molded body with the strongly mixed powder molded body in a metal tube may be used. Thereafter, the metal tube is subjected to wire drawing by the method described above (540), and the drawn wire is subjected to heat treatment (550).

<Second Embodiment>

Next, the second embodiment will be described. The high-density $MgB_2$ core 3 has a difficulty that the binding of particles is poor, considering that the filling rate is high. For improving it, it is effective to add weakly mixed powder to the raw material powder of the high-density $MgB_2$ core 3. When the weakly mixed powder is added, small B particles enter between particles of hard strongly mixed powder or $MgB_2$ powder. Then, $MgB_2$ is produced there, whereby the contact area between particles is expanded, and sintering is promoted.

Figure 3A:
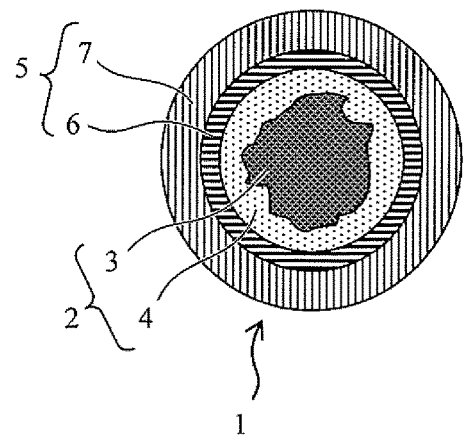
FIG. 3A is an example of a schematic view of a cross section perpendicular to the longitudinal direction of an MgB$_2$ superconducting wire in the second example of the present invention.
Figure 3B:
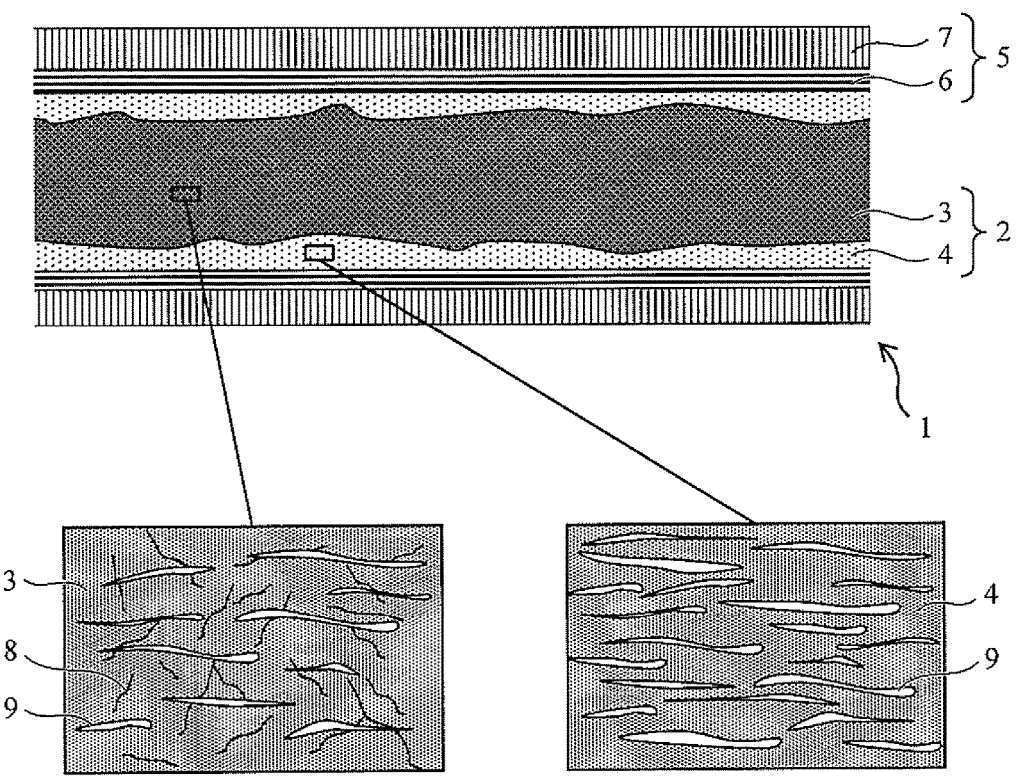
FIG. 3B is an example of a schematic view of a cross section along the longitudinal direction of an MgB$_2$ superconducting wire in the second example of the present invention.

FIG. 3A and FIG. 3B are an example of a schematic cross-sectional view of an $MgB_2$ superconducting wire in the second example of the present invention. The constitution other than the high-density $MgB_2$ core 3 is the same as in the first example, thus the explanation is omitted. In the present example, the weakly mixed powder is added to the raw material powder of the high-density $MgB_2$ core 3 to prepare the high-density $MgB_2$ core 3. In this case, voids 9 are generated in the high-density $MgB_2$ core 3 by diffusion of Mg, as shown in an enlarged view in FIG. 3B. Therefore, in the high-density $MgB_2$ core 3, the minute voids 8 of several μm or less and the voids 9 of several tens μm or so mixedly exist. While the filling rate is decreased by generation of the voids 9, the effect of binding improvement is larger than that, thus conduction characteristics are improved.

The void 9 has a flat shape which extends in the longitudinal direction of an $MgB_2$ superconducting wire, that is the same shape as the void 9 present in the low-density $MgB_2$ core 4. The weakly mixed powder is added to the highly mixed powder for the high-density $MgB_2$ core 3, thus the ratio of the void 9 in the high-density $MgB_2$ core 3 is smaller than the ratio of the void 9 in the low-density $MgB_2$ core 4. Considering conduction characteristics and the like, the ratio of the void 9 in the high-density $MgB_2$ core 3 is preferably 20% or less.

Figure 6:
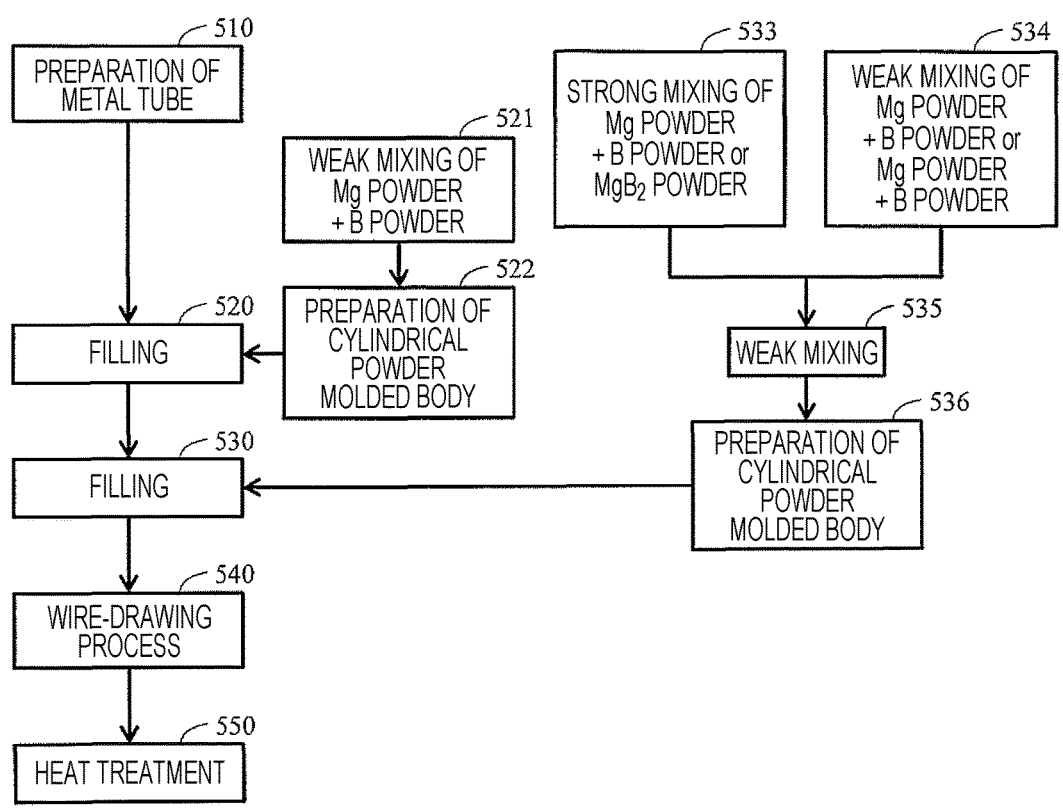
FIG. 6 is a diagram showing a step of producing the MgB$_2$ superconducting wire of the second example.

FIG. 6 is a diagram showing a method for producing the $MgB_2$ superconducting wire of the second example. The same number as in FIG. 5 is assigned for the step same as the content described in the first example, and the explanation is omitted. In the following, only a step of preparing a molded body of the mixed powder for the high-density $MgB_2$ core 3 will be described.

First, the Mg powder and the B powder are mixed by mechanical milling to prepare a strongly mixed powder of Mg and B (first mixed powder) (533). As a substitute for this, an MgB2 powder may be used. Also, the Mg powder and the B powder are slightly mixed using any of a ball mill apparatus, a V mixer, and a mortar as described above for the weakly mixed powder, to prepare a weakly mixed powder of Mg and B (second mixed powder) (534). Thereafter, the strongly mixed powder of Mg and B and the weakly mixed powder of Mg and B are slightly mixed to form a mixed powder for the high-density MgB2 core 3 (535). Then, a molded body of the mixed powder prepared in step 535 is prepared using a columnar mold (536).

<Evaluation of Conduction Characteristics>

The evaluation was performed also for the second embodiment. As the second embodiment, 10% by mass of the weakly mixed powder was added to the highly mixed powder described in the first example (highly mixed powder for the high-density $MgB_2$ core 3), and other procedures were carried out in the same manner as in the first embodiment to prepare a wire. As a result of evaluating Jc of the $MgB_2$ core in the same manner as in the first embodiment, Jc improvement of about further 15%, as compared to the wire of the first embodiment, could be confirmed.

According to the examples above, a superconducting wire having high conduction characteristics uniformly over a whole length can be provided. Also, by using the MgB$_2$ superconducting wire of the example above, a superconducting cable or superconducting magnet (applied to MRI, NMR or the like) which has high performance as compared with conventional ones can be realized.

The present invention is not limited to the examples described above, but includes various modifications. For example, the examples described above describe in detail to easily understand the present invention, and it is not necessarily limited to the example having all constitutions described above. In addition, a portion of the constitution of an example can be substituted by the constitution of another example, and also, the constitution of another example can be added to the constitution of an example. Also, another constitution can be added to, removed from, and substituted for a portion of the constitution of each example.

In the above examples, the MgB$_2$ core 2 was prepared with two cores, but may be prepared with three or more cores. In this case, it may be constituted so that the core density is reduced from the center toward the outside.

In the above examples, it was described about a round wire having a circular cross-sectional shape, and a single core wire having a single MgB$_2$ core. However, the same effect can be expected by the present invention, also for a square wire or tape wire having a square cross sectional shape and a multi-core wire having a plurality of MgB$_2$ cores.

REFERENCE SIGNS LIST

1 MgB$_2$ superconducting wire
2 MgB$_2$ core
3 high-density MgB$_2$ core (first MgB$_2$ core)
4 low-density MgB$_2$ core (second MgB$_2$ core)
5 metal sheath
6 barrier layer
7 stabilizing layer
8 void
9 void
41 strongly mixed powder molded body
42 weakly mixed powder molded body

The invention claimed is:

1. An MgB$_2$ superconducting wire comprising a core containing MgB$_2$ and a metal sheath which surrounds the core, wherein
   the core comprises at least a first MgB$_2$ core positioned on the center side, and a second MgB$_2$ core positioned outside the first MgB$_2$ core, and the density of the second MgB$_2$ core is lower than the density of the first MgB$_2$ core, and
   the density of the second MgB$_2$ is less than 70% of the true density of MgB$_2$,
   there are voids which extend in the longitudinal direction of the MgB$_2$ superconducting wire, in the first MgB$_2$ core, and
   the void in the first MgB$_2$ core has the same shape as a void present in the second MgB$_2$ core, and the ratio of the void in the first MgB$_2$ core is smaller than the ratio of the void in the second MgB$_2$ core.

2. The MgB$_2$ superconducting wire according to claim 1, wherein the density of the first MgB$_2$ core is 70% or more of the true density of MgB$_2$ (2.62 g/cm).

3. The MgB$_2$ superconducting wire according to claim 1, wherein the cross sectional area of the first MgB$_2$ core is 50% or more of the whole cross sectional area of the core.

4. The MgB$_2$ superconducting wire according to claim 1, wherein the ratio of the void in the first MgB$_2$ core is 20% or less.

5. The MgB$_2$ superconducting wire according to claim 1, wherein the MgB$_2$ superconducting wire is used as a superconducting cable or a superconducting magnet.

* * * * *

UNITED STATES PATENT AND TRADEMARK OFFICE
CERTIFICATE OF CORRECTION

PATENT NO. : 10,134,508 B2  
APPLICATION NO. : 15/038346  
DATED : November 20, 2018  
INVENTOR(S) : Ichiki et al.

Page 1 of 1

It is certified that error appears in the above-identified patent and that said Letters Patent is hereby corrected as shown below:

On the Title Page

Item [87], replace "WO 2015/187387" with "WO 2015/087387"

Signed and Sealed this  
Twenty-sixth Day of March, 2019

Andrei Iancu  
*Director of the United States Patent and Trademark Office*